United States Patent [19]

Suzuki et al.

[11] Patent Number: 5,738,971
[45] Date of Patent: Apr. 14, 1998

[54] PHOTOSENSITIVE COMPOSITION FOR TRANSFER SHEETS

[75] Inventors: Tamotsu Suzuki; Mikio Totsuka, both of Shizuoka, Japan

[73] Assignee: Fuji Photo Film Co., Ltd., Kanagawa, Japan

[21] Appl. No.: 575,464

[22] Filed: Dec. 20, 1995

Related U.S. Application Data

[63] Continuation of Ser. No. 321,136, Oct. 11, 1994, abandoned, which is a continuation-in-part of Ser. No. 147,160, Nov. 3, 1993, abandoned.

[30] Foreign Application Priority Data

Nov. 5, 1992 [JP] Japan ................. 4-322357

[51] Int. Cl.[6] ............................. G03C 1/805
[52] U.S. Cl. ............. 430/263; 430/271.1; 430/288.1; 430/259; 430/262; 430/257; 430/260
[58] Field of Search ................. 430/260, 281.1, 430/288.1, 271.1, 263, 259, 262, 257

[56] References Cited

U.S. PATENT DOCUMENTS

| | | | |
|---|---|---|---|
| 4,895,787 | 1/1990 | Platzer | 430/288 |
| 5,360,863 | 11/1994 | Meixner et al. | 525/28 |

FOREIGN PATENT DOCUMENTS

| | | |
|---|---|---|
| 2050947 | 3/1992 | Canada. |
| 63-91350 | 4/1988 | Japan. |
| 64-25147 | 1/1989 | Japan. |
| 3-152455 | 6/1991 | Japan. |
| 3-292372 | 12/1991 | Japan. |
| 3-292373 | 12/1991 | Japan. |

*Primary Examiner*—George F. Lesmes
*Assistant Examiner*—Laura Weiner
*Attorney, Agent, or Firm*—McAulay Fisher Nissen Goldberg & Kiel, LLP

[57] ABSTRACT

A photosensitive composition comprises an organic polymer and a photo-polymerizable monomer. The photo-polymerizable monomer has the following formula:

$$C + CH_2 - O - (R^1O)_n - CO - CR^2 = CH_2]_4$$

in which $R^1$ represents an alkylene group having 2 to 5 carbon atoms, $R^2$ represents a hydrogen atom or an alkyl group having 1 to 5 carbon atoms, and n represents the number of 0.5 to 5.

9 Claims, No Drawings

PHOTOSENSITIVE COMPOSITION FOR TRANSFER SHEETS

This is a continuation of application Ser. No. 08/321,136 filed Oct. 11, 1994 which is a continuation-in-part of Ser. No. 08/147,160 filed on Nov. 3, 1993, both now abandoned.

BACKGROUND OF THE INVENTION

1. Field of the Invention

The present invention relates to a photosensitive composition advantageously employable for a photosensitive transfer sheet which is utilized for preparing a color proof or a display sheet.

2. Description of Prior Art

There are heretofore known various image transfer processes comprising a step of imagewise exposing a photosensitive transfer material comprising an undercoat layer (peel layer) of an organic polymer, an image forming layer (photosensitive layer containing a coloring material or a composite layer of a coloring material layer and a photosensitive layer) provided on a temporary support to light; a step of developing it to form a color image on the undercoat layer; and a step of transferring the image to a permanent support using an adhesive (see, Japan Patent Publication Nos. 46(1971)-15326 and 49(1974)-441). These processes have advantages in that they can be used for preparing color proof by various procedures such as those of an overlay type and a surprint type. However, these processes have disadvantages in that an adhesive must be used in every transferring procedure and hence the processes are complicated and in that there is difficulty in keeping the accuracy of registration in transferring each color.

To eliminate the complicated procedures of the process, there have been proposed methods wherein after the formation of an image, the image is transferred to a permanent support under the application of heat and pressure (see, Japanese Patent Provisional Publications No. 47(1972)-41830, No. 48(1973)-9337 and No. 51(1976)-5101). Particularly, Japanese Patent Provisional Publication No. 51(1976)-5101 describes that an adhesive hot-melt polymer layer is provided on a permanent support, and Japanese Patent Provisional Publication No. 47(1972)-41830 describes that an image is transferred directly to a permanent support such as an art paper sheet or a coated paper sheet.

However, these processes have still various disadvantage in that the final image is transferred to a permanent support in such a manner that the right and the left are reversed against the original image and in that when a hot-melt polymer is used as an adhesive, the melting point thereof is usually high and hence the transferring temperature must be high so that the dimensional stability of the support is lowered by the action of heat and the deviation of colors from one another in the registration procedure is caused when each color is transferred. When a hot-melt polymer having a low melting point is used as an adhesive, there are caused problems that after the formation of an image, sticking is observed, or the surface thereof is liable to be damaged.

As a method for eliminating the above-described disadvantages, U.S. Pat. No. 4,482,625 proposes a process wherein an image is transferred to a temporary image-receiving sheet before the image is transferred to a permanent support. This process includes the steps of: preparing a temporary image-receiving sheet provided with an image receiving layer (i.e., photopolymerizable image-receiving layer or photopolymerizable adhesive layer) of a photopolymerizable material (e.g., ethylenically unsaturated multifunctional monomer) on a support; transferring an image of each color the temporary image-receiving sheet; retransferring said image to a permanent support with the photopolymerizable image receiving layer; and exposing a whole surface of it to light to cure the transferred photopolymerizable image receiving layer.

The above-described image transferring process using the temporary image-receiving sheet (hereinafter referred to simply as "image-receiving sheet") is very effective in eliminating the aforementioned problems. In more detail, there are given the following advantages. An erect image of the masked original can be obtained on the permanent support. Since an ethylenically unsaturated multifunctional monomer serving as a photopolymerizable substance is incorporated in the photopolymerizable image receiving layer of the image-receiving sheet, the photopolymerizable image-receiving sheet itself is soft, the transferring can be carried out at a low temperature, and after transferring, it can be exposed to light to cure. Thus, there are given advantages that after the transfer of the image, sticking is not observed and the final image has high resistance to damage.

The photosensitive transfer material (sheet) used in the process has a structure which comprises a support, a peel layer of an organic polymer and a photosensitive image forming layer comprising an organic polymer and a photopolymerizable monomer. If desired, an intermediate layer of an organic polymer is provided between the peel layer and the photosensitive image forming layer in order to prevent the area having no image from occurrence of coloring fog. The structure is basically similar to that of the photosensitive transfer material employed in the process using the adhesive.

In the image transferring process using the temporary image-receiving sheet, formation of the image such as a color separation image (for preparing color proof) is performed by imagewise exposing the above photosensitive transfer sheet to light, and developing the transfer sheet in a developing solution, similarly to other methods for image formation. Therefore, in order to fast perform such process for forming an image, it is particularly required to reduce the exposing time and the developing time. At the same time, it is also necessary to keep the obtained colored replica image from reduction of the image quality and from reduction of the transferring property.

The time period for performance of the process greatly depends upon the nature of photopolymerizable monomer employed for the image forming layer of the photosensitive transfer sheet. As the photopolymerizable monomer, trimethylolpropane triacrylate (see U.S. Pat. No. 4,482,625 mentioned above and U.S. Pat. No. 4,803,145), pentaerythritol poly(di, tri, or penta)acrylate (see U.S. Pat. No. 5,002,850 and U.S. Pat. No. 5,085,969) and trimethylolpropane ethoxylate triacrylate and trimethylolpropane propoxylate triacrylate (see CA 2,050,947 and U.S. Pat. No. 4,895,787) are described. The trimethylolpropane ethoxylate or propoxylate triacrylate does not show high curing rate although the resultant image is easily dissolved in a developing solution. The monomers of trimethylolpropane triacrylate and pentaerythritol polyacrylate have high curing rate, while the resultant image is hardly dissolved in a developing solution.

Further, the image obtained by the use of the monomers such as pentaerythritol polyacrylate is not accurately transferred onto the image receiving layer because the surface of the image is very hard and does not show appropriate tackiness. In addition, the unexposed area (non-image area) becomes occasionally insoluble in the developing solution due to excess exposure.

SUMMARY OF THE INVENTION

It is an object of the present invention to provide a photosensitive composition which is rapidly cured when it is exposed to light and which is rapidly dissolved in a developing solution when it is not cured.

It is another object of the present invention to provide a photosensitive composition advantageously employable for a photosensitive transfer sheet wherein the exposing time and the developing time are reduced with keeping the obtained colored replica image from the reduction of the image quality and the transferring property.

There is provided by the present invention a photosensitive composition comprising an organic polymer and a photo-polymerizable monomer having the following formula (1):

  (1)

in which $R^1$ represents an alkylene group having 2 to 5 carbon atoms, $R^2$ represents a hydrogen atom or an alkyl group having 1 to 5 carbon atoms, and n represents the number of 0.5 to 5.

The monomer of the formula (1) has four units represented by the following formula:

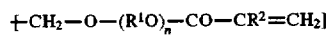

The numbers of "n" of the units may be the same or different from each other, alternatively may be partially the same. Thus, "n" of the formula (1) is the average of the four values. For example, the following compound has n of 0.5.

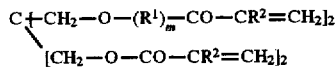

Preferred embodiments of the photosensitive composition are as follows:

1) The photosensitive transfer sheet wherein $R^1$ represents ethylene (—CH$_2$CH$_2$—) or isopropylene (—CH(CH$_3$)CH$_2$—).

2) The photosensitive transfer sheet wherein $R^2$ represents hydrogen or methyl.

3) The photosensitive transfer sheet wherein n represents 1 to 5 (more preferably 1 to 3).

4) The photosensitive transfer sheet wherein the photopolymerizable monomer further contains pentaerythritol polyacrylate (preferably pentaerythritol tetraacrylate) in the amount of 40 to 160 weight % based on the amount of the monomer of the formula (1).

Further, the photosensitive composition is advantageously employed as a photo-polymerizable monomer of a photosensitive transfer sheet. The photosensitive transfer sheet comprising a support and an image forming layer comprising the photosensitive composition.

Preferred embodiments of the photosensitive transfer sheet are as follows:

1) The photosensitive transfer sheet which has a peel layer comprising an organic polymer between the support and the image forming layer.

2) The photosensitive transfer sheet wherein the image forming layer further contains a coloring material (preferably pigment).

3) The photosensitive transfer sheet which further has a coloring material layer containing a coloring material (preferably pigment) between the support (or the peel layer) and the image forming layer.

The photosensitive transfer sheet is advantageously employed in an image forming process comprising the steps of:

(a) imagewise exposing to light the above photosensitive transfer sheet through a mask.

(b) developing the exposed photosensitive resin layer of the photosensitive transfer sheet using a developing solution to form a replica image on the support whereby preparing an image sheet;

(c) superposing one of the image sheet on an image receiving sheet which comprises a support and a photopolymerizable image-receiving layer provided thereon, in such a manner that the image is brought into contact with the image-receiving layer;

(d) combining the image sheet and the image receiving sheet with each other by application of heat and pressure;

(e) removing the support of the transfer sheet from the transfer sheet to transfer the image onto the image-receiving layer of the receiving sheet;

(f) superposing the receiving sheet having an image on a permanent support in such a manner that the image is brought into contact with the surface of the permanent support, to bond the receiving sheet to the permanent support by application of heat and pressure;

(g) exposing wholly a composite of the receiving sheet and the permanent support to active rays through the support of the receiving sheet to cure the photopolymerizable image receiving layer of the receiving sheet; and (h) removing the support of the receiving sheet from the composite to prepare the permanent support to which the image is transferred.

Further, the photosensitive transfer sheet is also advantageously employed in a multi-color image forming process comprising the steps of:

(a) exposing to light the above photosensitive transfer sheet through a color separation mask, (b) developing the exposed photosensitive resin layer of the photosensitive transfer sheet using a developing solution to form a color separation image on the support, whereby preparing a color proofing sheet having the color separation image;

(c) repeating both steps of (a) and (b) (i.e., exposing step and developing step) two or more times using different separation masks from each other to prepare two or more color proofing sheets;

(d) superposing one of the color proofing sheets on an image receiving sheet which comprises a support and a photopolymerizable image-receiving layer provided thereon, in such a manner that the separation image of the color proofing sheet is brought into contact with the image-receiving layer;

(e) combining the color proofing sheet and the image receiving sheet with each other by application of heat and pressure;

(f) removing the support of the transfer sheet from the transfer sheet to transfer the separation image onto the image-receiving layer of the receiving sheet;

(g) repeating three steps of (d) superposing step, (e) combining step and (f) removing step, two or more times to prepare a receiving sheet having two or more color separation images;

(h) superposing the receiving sheet which has a multicolor image consisting of the two or more color separation images on a permanent support in such a manner that the multi-color image is brought into contact with the surface of the permanent support, to bond the receiving sheet to the permanent support by application of heat and pressure;

(i) exposing wholly a composite of the receiving sheet and the permanent support to active rays through the support of the receiving sheet to cure the photopolymerizable able image receiving layer of the receiving sheet; and (j) removing the support of the receiving sheet from the composite to prepare the permanent support to which the multi-color image is transferred.

The photosensitive composition of the invention has an advantage in that the exposing time and the developing time is enabled to prominently reduce.

The photosensitive transfer sheet using the above composition of the invention has an advantage in that a time period for preparing a replica image is enabled to reduce. In more detail, when the image forming layer containing the composition, which constitutes the photosensitive transfer sheet, is exposed to a light, the exposed area can be sufficiently cured by a low exposing energy in the exposing procedure and the unexposed area can be accurately removed using a developing solution in a reduced time period in the developing procedure. Hence, use of the photosensitive transfer sheet enables the exposing time and the developing time to prominently reduce and whereby a time period for preparing a replica image can be reduced.

In preparation of a color proofing sheet, the process for the preparation is performed by repeating both a procedure for preparing a colored replica image and that for transfer and retransfer, so that a time period for the preparation of a color proofing sheet can be also reduced and hence the photosensitive transfer sheet of the invention is useful for preparation of a color proof in color proofing or production of display.

DETAILED DESCRIPTION OF THE INVENTION

The photosensitive composition of the invention contains an organic polymer and a photo-polymerizable monomer having the following formula (1). The composition is cured by exposure of a light such as UV rays, electron beam, far-infrared rays or microwave.

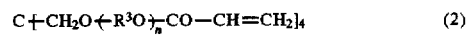

In the formula (1), $R^1$ is an alkylene group having 2 to 5 carbon atoms such as ethylene, propylene, isopropylene, butylene or isobutylene, and preferably ethylene or isopropylene. $R^2$ is hydrogen or an alkyl group having 1 to 5 carbon atoms such as methyl, ethyl, propyl, isopropyl, butyl, isobutyl or pentyl, and preferably hydrogen or methyl. "n" is the number (average value) of 0.5 to 5, generally 1 to 5 and especially 1 to 3.

Examples of the photopolymerizable monomer of the formula (1) preferably include monomers represented by the following formula (2):

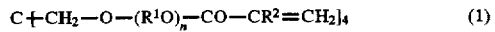

In the formula (2), $R^3$ preferably is ethylene or isopropylene. "n" has the same meaning as above.

Examples of the photopolymerizable monomer of the formula (1) more preferably include the following monomers:

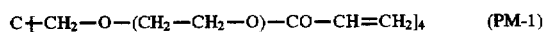 (PM-1)

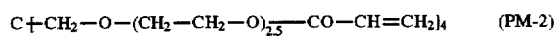 (PM-2)

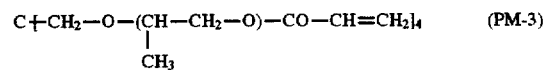 (PM-3)

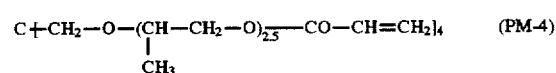 (PM-4)

The photopolymerizable monomer of the formula (1) is, for example, synthesized according to any of the following synthetic methods (1)–(3):

(1) Ethylene oxide adduct of pentaerythritol is reacted with acrylic acid through esterification to give a compound such as PM-1 or PM-2 described above.

(2) Ethylene oxide adduct of pentaerythritol is reacted with acryloyl chloride in the presence of appropriate base such as pyridine or triethylamine to give a compound such as PM-1 or PM-2.

(3) Ethylene oxide adduct of acrylic acid is reacted with pentaerythritol through etherification to give a compound such as PM-1 or PM-2. In this reaction, either the ethylene oxide adduct of acrylic acid or the pentaerythritol may be toluenesulfonate thereof or halogenide thereof.

The photosensitive composition of the invention may contain photopolymerizable mono- or multi-functional compounds (monomers) and/or photo-crosslinking compounds employable in the conventional photosensitive composition.

The photopolymerizable compounds preferably are multifunctional vinyl or vinylidene compounds having a boiling point of not lower than 150° C. which are capable of forming a polymer by photopolymerization.

Examples of the compounds include unsaturated esters of polyols (preferably acrylates or methacrylates of polyols) such as ethylene glycol diacrylate, glycerol triacrylate, ethylene glycol dimethacrylate, 1,3-propanediol dimethacrylate, polyethylene glycol dimethacrylate, 1,2,4-butanetriol trimethacrylate, trimethylol ethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentanediol dimethacrylate, bisacrylate or bismethacrylate of polyethylene glycol having molecular weight of 200 to 400 and the compounds analogous to these compounds. Preferred are pentaerythritol polyacrylates such as pentaerythritol diacrylate, pentaerythritol triacrylate and pentaerythritol tetraacrylate, and dipentaerythritol polyacrylate. Especially, pentaerythritoltetraacrylate is preferred. The monomers are preferably used in the amount of 40 to 160 weight % (more preferably 60 to 140 weight %) based on the amount of the monomer of the formula (1).

As the above compounds, unsaturated amides can be also employed. Preferred examples of the amides include unsaturated amides of acrylic acid or methacrylic acid having α, ω-diamines such as ethylene bismethacrylamide and ethylene bisacrylamide. The alkylene chain of the amides may be interrupted by an oxygen atom.

Examples of the photo-crosslinking compounds include polyvinylcinnamate derived from polyvinyl alcohol, and a combination of a compound having an azide group and a binder of polyacrylamide, polyacrylonitrile, alcohol-soluble nylon, rubbers, styrene/butadiene copolymer or phenol resin.

It is preferred that the monomer of the formula (1) according to the invention is employed together with at least one of pentaerythritoldiacrylate, pentaerythritol triacrylate, pentaerythritol tetraacrylate and dipentaerythritol polyacrylate. The photopolymerizable mono- or multi-functional compounds and/or photo-crosslinking compounds is preferably contained in the photosensitive composition in not more than 80 weight % and more preferably in not more than 40 weight % , based on the amount of the monomer of the formula (1).

The organic polymer employable for the photosensitive composition generally is a polymer derived from a vinyl monomer from the viewpoint of compatibility with the photopolymerizable monomer of the formula (1) and a photopolymerization initiator (which is generally used in the photosensitive composition). Preferred examples of the organic polymers include polyvinyl chloride, polyacrylic acid, polymethyl acrylate, polyethyl acrylate, polybutyl acrylate, polymethacrylic acid, polymethyl methacrylate, polyvinylether, polyvinyl acetal, and copolymer of at least two monomers selected from the group consisting of vinyl chloride, acrylic acid, methyl acrylate, ethyl acrylate, butyl acrylate, methacrylic acid, methyl methacrylate and vinyl ether.

In the photosensitive composition of the invention, a ratio between the total of both the amount of photopolymerizable mono- or multi-functional compounds and/or photo-crosslinking compounds and that of the monomers of the formula (1) and the amount of the organic polymer preferably is in the range of 1:10 to 2:1 (monomer:polymer), by weight.

The photosensitive composition of the invention generally contains a photopolymerization initiator capable of being activated by active rays. Preferred examples of the initiators include aromatic ketones such as benzophenone, Michler's ketone (4,4'-bis(dimethyl-amino)benzophenone), 4,4'-bis(diethylamino)benzophenone, 4-methoxy-4'-dimethylaminobenzophenone, 2-ethylanthraquinone, phenanthraquinone, and other aromatic ketones; benzoyl; benzoin ethers such as benzoin methyl ether, benzoin ethyl ether and benzoin phenyl ether; benzoins such as methylbenzoin and ethylbenzoin; and 2,4,5-triarytimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenyiimidazole dimer, 2-(o-methoxyphenyl)-4,5-diphenyiimidazole dimer, 2-(p-methoxyphenyl)-4,5-diphenylimidazole dimer, 2,4-di (p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer and dimers described in U.S. Pat. Nos. 3,479,185 and 3,784,557 and British Patent No. 1,047,569.

The photopolymerization initiator is generally contained in the range of 0.01 to 20 weight % based on the total of both the amount of photopolymerizable mono- or multi-functional compounds and/or photo-crosslinking compounds and that of the monomers of the formula (1).

The photosensitive composition of the invention may contain a thermal polymerization inhibitor. Examples of the thermal polymerization inhibitor include hydroquinone, p-methoxyphenol, alkyl or aryl-substituted hydroquinone, t-butylcatechol, pyrogallol, naphthylamine, β-naphthol, phenothiazine, pyridine, nitrobenzene, o-toluquinone, and arylphosphite.

Subsequently, the photosensitive transfer sheet of the invention is explained below.

The photosensitive transfer sheet of the invention has a structure basically comprising a support and an image forming layer. The image forming layer comprises the above photosensitive composition, i.e., the organic polymer and the photo-polymerizable monomer.

The photosensitive transfer sheet of the invention can be prepared according to the process described below.

The support of the photosensitive transfer sheet of the invention serves as a temporary support (while a final image is to be formed on a permanent support) in an image forming method utilizing the photosensitive transfer sheet of the invention. The material of the support can be selected from the conventional materials employed in the conventional photosensitive transfer sheet.

Examples of materials of the support include polyethylenelene terephthalate (PET), polycarbonate, polystyrene, cellulose derivatives such as cellulose triacetate, polyolefin such as polyethylene and polypropylene, and polyvinyl chloride. Preferred are polyethylene terephthalate, polycarbonate, and heat-treated materials thereof. Particularly, biaxially oriented polyethylene terephthalate is preferred from the viewpoint of strength, dimensional stability and thermostability and transparency. The thickness of the support generally is in the range of 50 to 150 μm.

On the surface of the image forming layer side of the support, a peel layer is preferably provided. The peel layer generally comprises the conventional organic polymer which shows non-tackiness at room temperature and tackiness under heating.

Materials employable for the peel layer can be appropriately chosen from known materials for a peel layer. Examples of such materials include polyacrylate, copolymer of acrylate/monomer polymerizable with the acrylate, polymethacrylate, copolymer of methacrylate/monomer polymerizable with the methacrylate, polyacrylamide, copolymer of acrylamide/monomer polymerizable with the acrylamide, polyvinyl acetate, copolymer of vinyl acetate/monomer polymerizable with the vinyl acetate, polyvinyl chloride, copolymer of vinyl chloride/monomer polymerizable with the vinyl chloride, polyvinylidene chloride, copolymer of vinylidene chloride/monomer polymerizable with the vinylidene chloride, polystyrene, copolymer of styrene/monomer polymerizable with the styrene, copolymers of ethylene/monomer polymerizable with the ethylene such as ethylene/vinyl acetate copolymer, ethylene/vinyl chloride copolymer and ethylene/acrylic acid copolymer, polyvinyl acetal, polyvinyl butyral, polyvinyl formal, polyester, polyamide such as alcohol-soluble polyamide, nylon and nylon of copolymer type, rubbers such as synthesized rubber and chlorinated rubber, polyhydroxystyrene, and polyolefin such as polyethylene and polypropylene. These materials can be employed singly or in combination of two or more kinds. A mixture of alcohol-soluble polyamide and polyhydroxystyrene is preferred.

The peel layer may contain any of various additives such as plasticizer and tackifier. The thickness of the peel layer generally is in the range of 0.2 to 10 μm and preferably 0.2 to 8 μm.

In the preparation of the photosensitive transfer sheet, an image forming layer generally containing coloring material or a coloring material layer (provided under the image forming layer) containing no coloring material is formed by coating on the peel layer a coating solution thereof which is prepared using a solvent such as methanol, ethanol or propanol. In this case, the solvent of the coating solution swells or dissolves the peel layer, so that color fogging sometimes occur in the non-image area (the area of the peel layer exposed by development). To prevent the occurrence of the color fogging, a barrier layer is formed on the peel layer, if desired. In the case that the peel layer is formed using a polymer material comprising alcohol-soluble polyamide, the above alcohol solvent in the coating solution for the image forming layer or coloring material layer is apt to produce the color fogging. Hence, a barrier layer comprising alcohol-insoluble polymer is preferably formed between the peel layer and the image forming layer to prevent the occurrence of the fogging. Materials employable for the barrier layer is selected by considering solvents employed in various coating procedures in the preparation of the photosensitive transfer sheet. Examples of materials employable for the barrier layer include polyacrylate, polymethacrylate (e.g., polymethyl methacrylate), acrylate/methacrylate copolymer, polyacrylamide, copolymer of acrylamide/monomer polymerizable with the acrylamide and cellulose derivatives.

The thickness of the peel layer generally is in the range of 0.2 to 10 μm and preferably 0.2 to 8 μm.

The image forming layer is provided on the support or the peel layer.

The photosensitive transfer sheet is advantageously employed for preparing a color proof. Therefore, four photosensitive, transfer sheets having color different from each other must be prepared, i.e., the image forming layers of the sheets are needed to be colored with yellow, magenta, cyan and black.

A coloring material may be contained in the image forming layer, otherwise may be contained in another layer (i.e., coloring material layer). The coloring material layer may be provided either on or under the image forming layer. However, the coloring material layer is preferably provided under the image forming layer from the viewpoint of sensitivity of the image forming layer. The coloring materials employable in the present invention can be chosen from known coloring materials. Examples of the coloring materials include pigments and dyes described in Japanese Patent Provisional Publications No. 47(1972)-16124, No. 52(1977)-89916, No. 55(1980)-117142 and No. 55(1980)-127552, U.S. Pat. No. 4,472,494 and Color index. Particularly, when the photosensitive transfer sheet is used as color proof for print, pigments are preferably used so as to allow color reproducibility to agree with the desired print.

Preferred examples of the pigments include Lionol yellow #1201 (C.I. 21090), Lionol yellow GRO (C.I. 21090), Shimura fast yellow 8GF (C.I. 21105), Benzidine yellow 4T-564D (C.I. 21095), Shimura fast red 4015 (C.I. 12355), Lionol red 7B4401 (C.I. 15850), Fastogen Blue TGR-L (C.I. 74160), Lionol blue SM (C.I. 26150), Mitsubishi carbon black MA-100 and Mitsubishi carbon black #40. Preferred examples of the dyes include Victoria pure blue (C.I. 42595), Auramine O (C.I. 41000), Cathilon brilliant flavin (C.I. basic 13), Rhodamine 6GCP (C.I. 45160), Rhodamine B (C.I. 45170), Safranine OK 70:100 (C.I. 50240), Erioglaucine X (C.I. 42080) and Fast black HB (C.I. 26150).

These pigments or dyes (coloring materials) may be used either alone or as a mixture of two or more of them. The coloring material is preferably contained in the coloring material-containing layer in the range of 1 to 60 weight % based on the weight of the total solid of the layer, more preferably in the range of 5 to 50 weight %.

Polymers which can be used to disperse or dissolve the coloring material therein, are disclosed in the aforementioned patent publications. An appropriate polymer can be chosen from those described therein. Particularly, alkali-soluble or alkali-swelling polymers are preferred from the viewpoint of cost performance, working environment and treatment of waste liquid.

Examples of the above alkali-soluble polymers include a polymer containing a group capable of forming a salt described in U.S. Pat. No. 2,893,368, a cellulose containing an acid group described in U.S. Pat. No. 2,927,022, copolymers of methacrylic acid such as copolymer of methacrylic acid and methyl methacrylate described in OLS No. 2,123,702, polymers containing acid such as copolymer of styrene and mono-n-butyl maleate and copolymer of vinyl acetate and crotonic acid described in OLS No. 2,205,146, polymers containing a carboxylic acid group such as copolymer of acrylic acid and at least one alkyl acrylate described in OLS No. 2,320,849, and copolymers such as copolymer of methacrylic acid and an aralkyl methacrylate described in Japanese Patent Publication No. 59(1984)-44615. Further, there can be employed organic polymers such as phenol resin, rosin and polyhydroxystyrene described in Japanese Patent Provisional Publications No. 47(1972)-16124, No. 52(1977)-89916, No. 55(1980)-117142, No. 55(1980)-127552 and U.S. Pat. No. 4,472,494.

Additives such as a plasticizer, a stabilizer for dispersing pigment and a surface-active agent may be incorporated into the coloring material layer, if desired.

The coloring material layer is, for example, formed by coating a coating solution prepared by dissolving the above materials in an appropriate solvent on the support or the peel layer and drying the coated layer. The coloring material generally contains in the coloring material layer in the amount of 5 to 50 weight %. The coloring material layer generally has a thickness of 0.05 to 10 μm, and preferably 0.1 to 5 μm.

The image forming layer comprises the photosensitive composition of the invention described above (in this case, the coloring material layer is provided either on or under the image forming layer), or comprises the photosensitive composition and the above coloring material.

Hence, the image forming layer comprises the photopolymerizable monomer of the formula (1) and the organic polymer and may further contain materials appropriately materials chosen from those for the photosensitive composition. Preferred are organic polymers which can be developed with water or an aqueous alkaline solution.

The image forming layer, regardless that contains coloring material or no coloring material, generally has a thickness of 0.1 to 20 μm, and preferably 0.4 to 5 μm.

The image forming layer can be formed on the support according to a known method. In more detail, the polymerizable monomer, the organic polymer, the photopolymeriztion initiator, and the thermalpolymerization inhibitor if desired, are dissolved in an organic solvent to prepare a coating solution. The solution is coated on the support (or the peel layer) or the coloring material layer by a coating method such as a rotatable coating method (e.g., whirler coating, spinner coating), a web coating method (e.g., gravure coating, doctor blade coating, wire bar coating), or a dipping method, and then dried to form the image forming layer.

The method for forming the image forming layer is described in detail in Japanese Patent Publications No. 46-15326, No. 46-35682 and No. 55-6210, Japanese Patent Provisional Publications No. 44-72494, No. 47-41830, No. 48-3337, No. 49-441, No. 51-5101, No. 59-97140 and No. 60-6694, and U.S. Pat. No. 3,887,450.

A protective layer may be formed on the image forming layer for the purpose of improvement of scratch resistance and prevention against lowering of sensitivity by oxygen. Examples of polymers employable for the protective layer include polyvinyl alcohol, polyvinyl acetate, methyl vinyl ether/maleic anhydride copolymer, poly(N-vinylpyrrolidone), gelatin and gum Arabic. The protective layer is formed by coating a solution of the above polymer on the image forming layer and drying the coated layer.

The photosensitive transfer sheet prepared above can be employed for color proofing by the following operations according to the known surprint method.

1) Imagewise exposure is conducted by superposing a color separation mask on the photosensitive transfer sheet and irradiating it with active rays (exposure process).

2) After the imagewise exposure is complete, the transfer sheet is developed with a developing solution (aqueous alkali solution), washed with water and dried. Thus, a color separation image is formed on the peel layer (development process).

3) Using another photosensitive transfer sheet(s), the above exposure process and development process are repeated by times necessary for preparing differently colored sheets to prepare the color proofing sheets corresponding to two or more colors.

4) The color proofing sheet having a separation image of the first color is superposed on a receiving sheet comprising a support and a photopolymerizable image-receiving layer provided thereon in such a manner that the surface of the separation image side is brought into contact with the image-receiving layer, and then they are bonded with each other by application of heat and pressure. Thus, the separation image is so bonded to the image-receiving layer as to be pressed and entered the layer. Subsequently, the support (temporary support) of the transferfer sheet is peeled from the transfer sheet to transfer the separation image together with the peel layer onto the image-receiving layer of the receiving sheet (transfer process).

Further, remaining color proofing sheets are subjected to the similar operation as above. In more detail, the separation images on and after the second color are registered to the separation image of the first color, to be transferred to the same receiving sheet in order. Thus, the separation images corresponding to two or more colors are transferred onto the receiving sheet under the condition that the separation images are embedded in the image receiving layer.

5) The receiving sheet to which the multi-color image is transferred is superposed on a white paper (permanent support) in such a manner that the multi-color image is brought into contact with the white paper, and the receiving sheet is bonded to the white paper by application of heat and pressure.

6) The composite is wholly exposed to active rays through the support of the receiving sheet to cure the photopolymerizable image receiving layer.

7) The support (temporary support) of the receiving sheet is peeled from the image-transferred the separation image-transferred to the white paper. If desired, the fine unevenness may be formed on the surface of the image receiving layer by superposing a mat film on the image receiving layer by application of press and heat.

As examples of the permanent support other than the white paper, there can be mentioned papers such as art paper and coat paper, woodfree paper and groundwood paper, substitutes for paper such as a plastic film containing white pigment, plastic films such as films of poly(ethylene phthalate) and polycarbonate, a glass, a metal plate and a cloth.

Otherwise, the color proofing sheets may be directly transferred onto the permanent support without use of the receiving sheet.

The color proofing sheets of two or more colors which are prepared by repeating the above exposure and development processes may be employed for color proofing of the overlay method by directly and exactly superposing the sheets one on another, if desired.

The present invention is further described by the following examples.

EXAMPLE 1

(A) Preparation of photosensitive transfer sheet

A coating solution for forming a peel layer having the following composition was prepared.

Coating solution for peel layer

| | |
|---|---|
| Alcohol-soluble polyamide (CM-8000, viscosity: 23 cps (20° C., 10 weight % methanol solution), available from Toray Industries, Inc.) | 7.2 g |
| Polyhydroxystyrene (Resin M, mean molecular weight: 5,500, available from Maruzen Oil Co., Ltd.) | 1.8 g |

The above coating solution was uniformly coated on a polyethylene terephthalate film (support) having the thickness of 100 µm using a whirler, and the coated layer was dried to form a peel layer having thickness of 0.5 µm. Four supports having a peel layer were prepared by repeating the above coating procedure four times.

In order to form the image forming layer for N→P type image formation, four kinds of coating solutions for forming the image forming layers of yellow (Y), magenta (M), cyan (C) and black (B), which have the following compositions, were prepared.

Coating solution for yellow image forming layer

| | |
|---|---|
| Benzyl methacrylate/methacrylic acid copolymer (Copolymerization ratio (molar ratio): 73/27, viscosity η: 0.12) | 60 g |
| Monomer having the formula (1) (above-mentioned compound: PM-1) | 21.6 g |
| Pentaerythritol tetraacrylate | 21.6 g |
| Michler's ketone | 2.4 g |
| 2-(o-Chlorophenyl)-4,5-diphenylimidazole dimer | 2.5 g |
| Seika Fast Yellow H-0755 (available from Dainichiseika Color & Chemicals Mfg. Co., Ltd.) | 9.4 g |
| Methyl cellosolve acetate | 560 g |
| Methyl ethyl ketone | 280 g |

The above "viscosity η" means limiting viscosity in methyl ethyl ketone solution of the polymer at 25° C.

Coating solution for magenta image forming layer

The solution had the same composition as that of the yellow image forming layer except for changing the Seika Fast Yellow H-0755 into 5.2 g of Seika Fast Carmine-1483 (available from Dainichiseika Color & Chemicals Mfg. Co., Ltd.).

Coating solution for cyan image forming layer

The solution had the same composition as that of the yellow image forming layer except for changing the Seika Fast Yellow H-0755 into 5.6 g of Cyanine blue-4920 (available from Dainichiseika Color & Chemicals Mfg. Co., Ltd.).

Coating solution for black image forming layer

The solution has had same composition as that of the yellow image forming layer except for changing the Seika Fast Yellow H-0755 into 6.6 g of Mitsubishi carbon black MA-100 (available from Mitsubishi Chemical industries, Ltd.).

Each of the four kinds of coating solutions (four colors) was independently coated on the peel layer of the support and dried to form an image forming layer having thickness of 2.4 µm. Four supports having the four kinds of the image forming layer were prepared by repeating the above coating procedure four times.

A coating solution for forming a protective layer having the following composition was prepared.

Coating solution for protective layer

| | |
|---|---|
| Polyvinyl alcohol (GL-05, available from Nippon Synthetic Chemical Industry Co., Ltd.) | 60 g |
| Water | 970 g |
| Methanol | 30 g |

The above coating solution was coated on the four image forming layers using a whirler, and the coated layers provided on the four image forming layers were dried to form protective layers having thickness of 1.5 µm.

Thus, four kinds (four colors) of photosensitive transfer sheets (negative type colored photosensitive transfer sheets) comprising a support, a peel layer, an image forming layer and a protective layer, superposed in order, were prepared.

EXAMPLE 2

The procedures of Example 1 were repeated except for using the above-mentioned PM-2 instead of the above-mentioned PM-1 as the photopolymerizable monomer to prepare photosensitive transfer sheets of four colors.

EXAMPLE 3

The procedures of Example 1 were repeated except for using the above-mentioned PM-3 instead of the above-mentioned PM-1 as the photopolymerizable monomer to prepare photosensitive transfer sheets of four colors.

EXAMPLE 4

The procedures of Example 1 were repeated except for using the above-mentioned PM-4 instead of the above-mentioned PM-1 as the photopolymerizable monomer to prepare photosensitive transfer sheets of four colors.

COMPARISON EXAMPLE 1

The procedures of Example 1 were repeated except for using 43.2 g of pentaerythritol tetraacrylate instead of 21.6 g of the above-mentioned PM-1 and 21.6 g of pentaerythritol tetraacrylate as the photopolymerizable monomer to prepare photosensitive transfer sheets of four colors.

COMPARISON EXAMPLE 2

The procedures of Example 1 were repeated except for using 43.2 g of trimethylolpropane ethoxylate triacrylate having the formula (A) instead of 21.6 g of the above-mentioned PM-1 and 21.6 g of pentaerythritol tetraacrylate as the photopolymerizable monomer to prepare photosensitive transfer sheets of four colors.

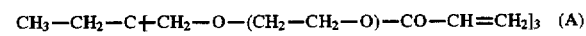

$$CH_3-CH_2-C+CH_2-O-(CH_2-CH_2-O)-CO-CH=CH_2]_3 \quad (A)$$

COMPARISON EXAMPLE 3

The procedures of Example 1 were repeated except for using 43.2 g of trimethylolpropane propoxylate triacrylate having the formula (B) instead of 21.6 g of the above-mentioned PM-1 and 21.6 g of pentaerythritol tetraacrylate as the photopolymerizable monomer to prepare photosensitive transfer sheets of four colors.

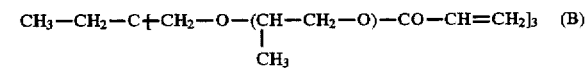

$$CH_3-CH_2-C+CH_2-O-(CH-CH_2-O)-CO-CH=CH_2]_3 \quad (B)$$
$$\qquad\qquad\qquad\qquad\qquad |$$
$$\qquad\qquad\qquad\qquad\quad CH_3$$

(B) Imagewize exposure and development

The photosensitive transfer sheets each was exposed through a color separating mask (corresponding to each of four colors of photosensitive transfer sheets) to a light from a super high-pressure mercury lamp (P-607FW, 1 kW, available from Dainippon Screen Mfg. Co., Ltd.). Thus, latent images were formed on the photosensitive resin layers.

Using an automatic developing machine (Color Art Processor CA-600P, available from Fuji Photo Film Co., Ltd.), each of the exposed sheets was automatically developed using the developing solution in which developing solution for Color art CA-1 (available from Fuji Photo Film Co., Ltd.) was diluted five times by the diluent, at 31° C. to form an image. In such way, color proofing sheets of four colors, in which the color separating masks were accurately copied, were obtained.

In the preparation of the color proofing sheets, the exposure of the image forming layer was performed by variation of exposing amount using Fuji Step Guide P, to determine the minimum exposing time period (necessary exposing time) required to obtain the predetermined density. Further, after exposure for the minimum exposing time, the time period (necessary developing time) required to dissolve and remove the unexposed area of the image forming area The results are set forth in Table 1.

TABLE 1

| | Exposing Time (second) | Developing Time (second) |
|---|---|---|
| Example 1 | 58 | 14 |
| Example 2 | 58 | 14 |
| Example 3 | 55 | 16 |
| Example 4 | 50 | 18 |
| Com. Ex. 1 | 60 | 22 |
| Com. Ex. 2 | 140 | 16 |
| Com. Ex. 3 | 120 | 18 |

From the results shown in Table 1, the photosensitive transfer sheets containing the monomer having the formula (1) of Examples 1 to 4 are reduced in the exposing time and the developing time compared with the sheet of Comparison Example 1 containing no monomer of the formula (1). Further, the photosensitive transfer sheets of Examples 1 to 4 are reduced in the exposing time compared with the sheets of Comparison Examples 2 to 3 containing no monomer of the formula (1). Hence, it is apparent that use of the photosensitive transfer sheet of the invention brings about reduction of a time period for preparation of an image.

Separately, a receiving sheet was prepared. On a diaxially oriented poly(ethylene terephthalate) of 100 μm thick, a coating solution for an image receiving layer having the following composition was coated to form the image receiving layer of a thickness of 20 μm, whereby the receiving sheet was prepared.

Coating solution for formation of an image receiving layer

| | |
|---|---|
| Poly(methyl methacrylate) (mean molecular weight: 100,000, available from Wako Junyaku Co., Ltd.) | 90 g |
| Pentaerythritol tetraacrylate | 90 g |
| 2,2-Dimethoxy-2-phenylacetophenone | 3.18 g |
| p-Methoxyphenol | 0.09 g |
| Methyl ethyl ketone | 220 g |

Subsequently, the color proofing sheet of black color was superposed in perfect registration on the above image-receiving sheet so that the image side was brought into contact with the image receiving layer and was laminated using Color art transfer machine CA-600T (available from Fuji Photo Film Co., Ltd.). The poly(ethylene terephthalate) support of the color proofing sheet was peeled away to transfer a black image to the image-receiving sheet. As to other three kinds (three colors) of color proofing sheets, their images were transferred in sequence to the same image-receiving sheet in the same manner as the above process, to obtain an image-receiving sheet in which halftone dot-images of four colors were satisfactorily formed.

Subsequently, the image-receiving sheet, in which the four color images were transferred, and art paper (permanent support) were superposed so that the image side was brought into contact with the art paper to laminate them using the Color art transfer machine, and the composite was wholly exposed to UV rays (P-607FW, 1 kW, available from Dainippon Screen Mfg. Co., Ltd.) through the receiving sheet for 120 seconds. Then the support of the image-receiving sheet was peeled away to form the final image (color proof) having distinct image to the art paper.

From the above result, it is apparent that the use of the photosensitive transfer sheet of the invention not only brings about reduction of a time period for preparation of an image but also shows excellent image-transferring property.

We claim:

1. A photosensitive transfer sheet comprising a support, a peel layer thereon and an image forming layer provided on the peel layer which comprises a combination of an organic polymer derived from a vinyl monomer and a mixture of pentaerythritol tetraacrylate and a photo-polymerizable monomer having the following formula (1):

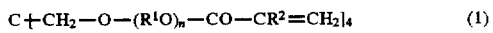

in which
R¹ represents —CH₂CH₂— or —CH(CH₃)CH₂—,
R² represents a hydrogen atom, and
n is a value in the range of 0.5 to 5.0, said value being an average value obtained by dividing the total number of —(R¹O)—units in the formula (1) by four;
the mixture containing the pentaerythritol tetraacrylate in an amount of 40 to 160 weight % based on an amount of the photo-polymerizable monomer of the formula (1).

2. The photosensitive transfer sheet as defined in claim 1 wherein the organic polymer is a copolymer of at least two monomers selected from the group consisting of vinyl chloride, acrylic acid, methyl acrylate, ethyl acrylate, butyl acrylate, methacrylic acid, methyl methacrylate and vinyl ether.

3. The photosensitive transfer sheet as defined in claim 1 wherein the organic polymer is a copolymer of benzyl methacrylate and methacrylic acid.

4. The photosensitive transfer sheet as defined in claim 1 wherein the photo-polymerizable monomer is at least one monomer selected from the group consisting of the following monomers:

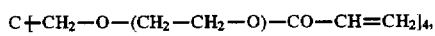

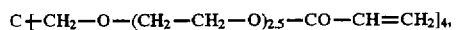

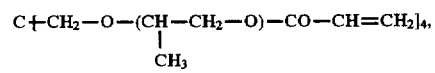

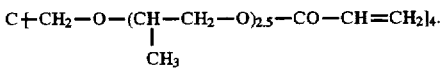

5. The photosensitive transfer sheet as defined in claim 1 wherein n is a value in the range of 1 to 3.

6. The photosensitive transfer sheet as defined in claim 1 wherein a ratio between the organic polymer and the photo-polymerizable monomer is in the range of 1:10 to 2:1 by weight.

7. The photosensitive transfer sheet as defined in claim 1 wherein the mixture contains the pentaerythritol tetraacrylate in an amount of 60 to 140 weight % based on an amount of the photo-polymerizable monomer of the formula (1).

8. The photosensitive transfer sheet as defined in claim 1, wherein the peel layer comprises at least one polymer selected from the group consisting of polyacrylate, copolymer of acrylate/monomer polymerizable with the acrylate, polymethacryalate, copolymer of methacrylate/monomer polymerizable with the methacrylate, polyacrylamide, copolymer of acrylamide/monomer polymerizable with the acrylamide, polyvinyl acetate, copolymer of vinyl acetate/monomer polymerizable with the vinyl acetate, polyvinyl chloride, copolymer of vinyl chloride/monomer polymerizable with the vinyl chloride, polyvinylidene chloride, copolymer of vinylidene chloride/monomer polymerizable with the vinylidene chloride, polystyrene, copolymer of styrene/monomer polymerizable with the styrene, ethylene/vinyl acetate copolymer, ethylene/vinyl chloride copolymer, ethylene/acrylic acid copolymer, polyvinylacetal, polyvinyl butyral, polyvinyl formal, polyester, alcohol-soluble polyamide, nylon, synthesized rubber, chlorinated rubber, polyhydroxystyrene, polyethylene and polypropylene.

9. The photosensitive transfer sheet as defined in claim 1, wherein the peel layer comprises a mixture of alcohol-soluble polyamide and polyhydroxystyrene.

* * * * *